(12) United States Patent
Tanaka et al.

(10) Patent No.: US 6,952,021 B2
(45) Date of Patent: Oct. 4, 2005

(54) THIN-FILM TRANSISTOR AND METHOD FOR MAKING THE SAME

(75) Inventors: Tsutomu Tanaka, Kanagawa (JP); Masahiro Fujino, Kanagawa (JP); Hisao Hayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/051,267

(22) Filed: Jan. 18, 2002

(65) Prior Publication Data

US 2002/0063254 A1 May 30, 2002

Related U.S. Application Data

(62) Division of application No. 09/827,676, filed on Apr. 6, 2001.

(51) Int. Cl.[7] .................... H01L 29/04; H01L 31/036; H01L 31/0376; H01L 31/20
(52) U.S. Cl. ................... 257/59; 257/66; 257/70; 257/72; 257/75
(58) Field of Search ............................ 257/59, 66, 70, 257/72, 75

(56) References Cited

U.S. PATENT DOCUMENTS

| | | | | |
|---|---|---|---|---|
| 5,103,330 A | * | 4/1992 | Fakami et al. | 257/59 |
| 5,726,461 A | * | 3/1998 | Shimada et al. | 257/59 |
| 6,218,206 B1 | * | 4/2001 | Inoue et al. | 438/159 |
| 6,246,070 B1 | * | 6/2001 | Yamazaki et al. | 257/347 |
| 6,281,552 B1 | * | 8/2001 | Kawasaki et al. | 257/350 |
| 6,358,766 B1 | * | 3/2002 | Kasahara | 438/149 |
| 2002/0000555 A1 | * | 1/2002 | Fujikawa et al. | 257/59 |

FOREIGN PATENT DOCUMENTS

| | | |
|---|---|---|
| JP | 8-279618 | 10/1996 |
| JP | 10-189252 | 7/1998 |
| JP | 11-251069 | 9/1999 |

OTHER PUBLICATIONS

Modern Liquid Crystal Process Technology '99, Press Journal, 1998, pp. 53–59.
Flat Panel Display 1999, Nikkei BP, pp. 132–139.

* cited by examiner

*Primary Examiner*—Thien F Tran
(74) *Attorney, Agent, or Firm*—Sonnenschein, Nath & Rosenthal LLP

(57) ABSTRACT

A bottom-gate thin-film transistor includes a gate electrode, a gate insulating film, an active layer, and a protective insulating film deposited in that order on a substrate. The protective insulating film has a thickness of 100 nm or less, and the protective insulating film is formed on any one of the active layer, and LDD region, and a source-drain region. A method for making a bottom-gate thin-film transistor, a liquid crystal display device including a TFT substrate using the bottom-gate thin-film transistor and a method for fabricating the same, and an organic EL device including the bottom-gate thin-film transistor and a method for fabricating the same are also disclosed.

4 Claims, 7 Drawing Sheets

RELATED-ART

FIG. 7A RELATED-ART
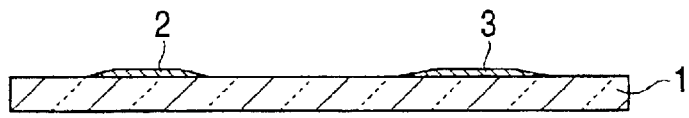
FIG. 7B RELATED-ART
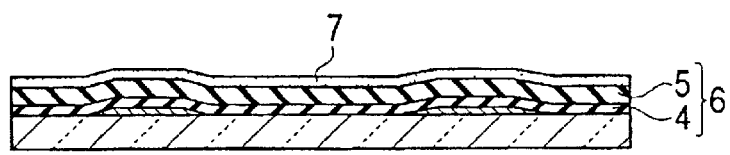
FIG. 7C RELATED-ART
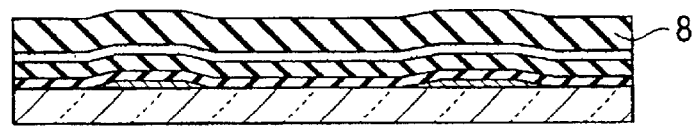
FIG. 7D RELATED-ART
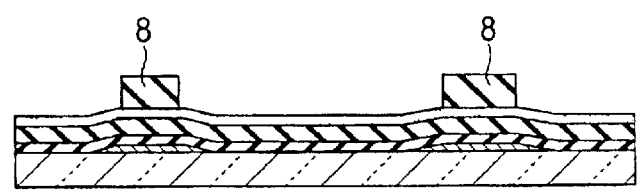
FIG. 7E RELATED-ART
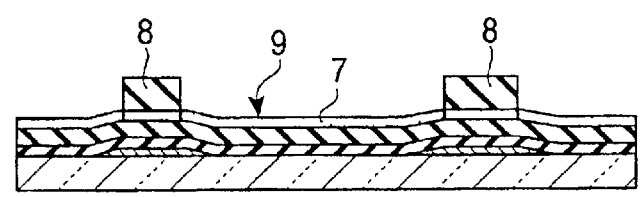
FIG. 7F RELATED-ART
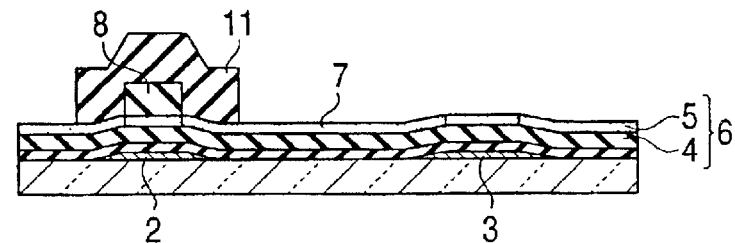
FIG. 7G RELATED-ART
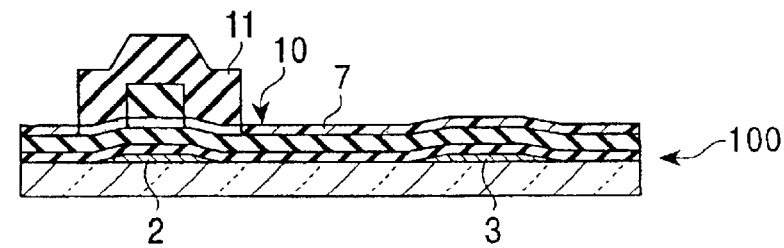

RELATED-ART

RELATED-ART

RELATED-ART

RELATED-ART

RELATED-ART

THIN-FILM TRANSISTOR AND METHOD FOR MAKING THE SAME

RELATED APPLICATION DATA

This application claims priority to Japanese Application No. P2000-105304, filed Apr. 6, 2000, and is a divisional of U.S. application Ser. No. 09/827,676, filed Apr. 6, 2001, both of which are incorporated herein by reference to the extent permitted by law.

BACKGROUND OF THE INVENTION

1. Field of the Invention

The present invention relates to bottom-gate thin-film transistors and methods for making the same, and also relates to liquid crystal display devices and organic EL devices using the bottom-gate thin-film transistors.

2. Description of the Related Art

Thin-film transistors (TFTs) are generally used as switching elements in active matrix liquid crystal display devices, active matrix organic EL display devices, etc. Thin-film transistors fall into two broad categories: a bottom-gate type and a top-gate type. In the bottom-gate thin-film transistor, a gate electrode is disposed below an active layer, and the bottom-gate thin-film transistor has superior reliability in comparison with the top-gate thin-film transistor. Additionally, structures of bottom-gate thin-film transistors are described in detail, for example, in MODERN LIQUID CRYSTAL PROCESS TECHNOLOGY '99 (Press Journal, 1998, pp.53 to 59), FLAT PANEL DISPLAY 1999 (Nikkei BP, 1998, pp.132 to 139), and Japanese Unexamined Patent Application Publication No. 8-279618.

FIG. 6 is a schematic sectional view of a liquid crystal display device using a conventional bottom-gate thin-film transistor, and FIGS. 7A to 7G and FIGS. 8H to 8L show the steps for fabricating the liquid crystal display device.

In the fabrication process, first, a gate electrode 2 composed of a metal, such as Cr, Al, Mo, or Ta, is formed, with a thickness of approximately 200 nm, on a transparent glass substrate 1, and a Cs electrode 3 is similarly formed, as shown in FIG. 7A.

A gate insulating film 6 is deposited on the gate electrode 2, and the gate insulating film 6, for example, consists of a silicon nitride film 4 with a thickness of 50 nm and a silicon oxide film 5 with a thickness of 150 nm. After the gate insulating film 6 is deposited, an amorphous silicon film is continuously deposited with a thickness of 50 nm. The amorphous silicon film is then crystallized by thermal annealing with an infrared lamp, laser annealing, or the like to form a polysilicon film 7, as shown in FIG. 7B.

Next, a protective insulating film 8 composed of a silicon oxide is formed with a thickness of 200 nm, as shown in FIG. 7C. A resist is placed on the protective insulating film 8, and by exposure from the back surface using the gate electrode 2 as a mask, the resist is patterned on a channel-forming section self-aligned with the gate electrode 2. The protective insulating film 8 is removed by etching using the resist as a mask so that the protective insulating film 8 remains in the channel-forming section self-aligned with the gate electrode 2, as shown in FIG. 7D. In the etching process, hydrofluoric acid-based wet etching or fluorine-based dry etching is usually used.

Next, ions, such as phosphorus ions or arsenic ions, are implanted using the protective insulating film 8 composed of the silicon oxide as a mask, to form a lightly doped drain (LDD) region 9, as shown in FIG. 7E. Next, an N-channel source-drain-injection resist mask (SD-injecting mask) 11 is formed using a resist or the like, and the protective insulating film 8 on the polysilicon film 7 in a source-drain region (SD region) and in an auxiliary capacitor region comprising the polysilicon film 7 and the gate electrode 2 is removed by hydrofluoric acid-based wet etching or fluorine-based dry etching, as shown in FIG. 7F. An N-channel source-drain region (SD region) 10 is then formed by injection of phosphorus, arsenic, or the like at high concentration. Furthermore, in order to activate the dopant, such as the injected phosphorus, thermal annealing or laser annealing is performed so that the non-doped portion of the polysilicon film 7 constitutes an active layer, and thus a TFT 100 is obtained, as shown in FIG. 7G.

Next, a resist is placed on the section of the substrate 1 having the TFT 100, and unwanted portions of the protective insulating film 8 and the polysilicon film 7 are patterned, as shown in FIG. 8H. In such a case, etching of the protective insulating film 8 is usually performed by hydrofluoric acid-based wet etching or fluorine-based dry etching. Etching of the polysilicon film 7 is often performed by F-based or Cl-based dry etching.

Next, in order to form an interlayer insulating film 13, a silicon nitride film 14 (300 nm) and a silicon oxide film 15 (200 nm) are continuously deposited, as shown in FIG. 8I.

The interlayer insulating film 13 and the gate insulating film 6 are removed by etching at a contact-forming section on the polysilicon film 7 and a contact-forming section (not shown in the drawing) on the gate electrode 2, and thus contact holes 16 are made, as shown in FIG. 8J. By embedding a metal, such as Al, in the contact holes 16, a source electrode 17 and a drain electrode 18 are formed, as shown in FIG. 8K.

Next, a planarizing layer 19 composed of an organic planarizing film, a silicon nitride planarizing film, or the like is formed in the region excluding a section for forming a contact with a transparent electrode of the liquid crystal display panel and a pad-forming section. A transparent electrode 20 composed of ITO or the like is then formed so as to cover the pixel section, and an alignment layer 21 is formed on the transparent electrode 20. Thus, a TFT substrate 201 is obtained, as shown in FIG. 8L.

A liquid crystal display device 200 shown in FIG. 6 has a panel structure including the thus-obtained TFT substrate 201, a counter substrate 203 provided with a counter electrode 202, and a liquid crystal 204 interposed between both substrates.

In the TFT 100 used in the conventional liquid crystal display device shown in FIGS. 6 to 8L, the auxiliary capacitor is constructed by the polysilicon film 7 doped with phosphorus or the like at high concentration and the Cs electrode 3 (the same layer as that of the gate electrode 2), and in order to form such a shape, the protective insulating film 8 on the polysilicon film 7 must be removed by etching twice, as shown in FIGS. 7D and 7F. Therefore, a complex process is required, thus preventing an improvement in productivity.

Additionally, in the region in which the protective insulating film 8 is removed by the first etching (refer to FIG. 7D), the polysilicon film 7 is exposed from the beginning in the step of removing the protective insulating film 8 by the second etching (refer to FIG. 7F). At this stage, since the polysilicon film 7 has been transformed into the LDD region 9 in which the N-channel is formed by implantation of phosphorus ions, arsenic ions, or the like, pinholes, etc. easily occur due to corrosion by an alkaline resist stripper and a hydrofluoric acid-based etchant. Consequently, the polysilicon film 7 in this section and the gate insulating film 6 (the silicon oxide film 5, in particular) therebelow may be etched by the hydrofluoric acid-based etchant, resulting in a decrease in the breakdown voltage of the gate insulating film 6 between the polysilicon film 7 and the Cs electrode 3 (or the gate electrode 2).

SUMMARY OF THE INVENTION

Accordingly, it is an object of the present invention to provide a bottom-gate thin-film transistor and a method for making the same, in which productivity is improved by reducing the number of process steps, an insufficient breakdown voltage of the gate insulating film is prevented, and the yield of the product is improved.

By setting the thickness of the protective insulating film 8 at 100 nm or less instead of approximately 200 nm in the process for fabricating the conventional bottom-gate TFT, and by injecting the dopant through the protective insulating film 8 when the LDD region 9, or the source-drain region 10 is formed subsequently, it is possible to eliminate the etching step of the protective insulating film 8 and also an insufficient breakdown voltage of the gate insulating film 6 can be overcome. Moreover, it has also been found that the structure of such a TFT or the method for fabricating the same can be employed far liquid crystal display devices and organic EL devices driven by TFTs.

In one aspect of the present invention, a bottom-gate thin-film transistor includes a gate electrode, a gate insulating film, an active layer, and a protective insulating film deposited in that order on a substrate, in which the protective insulating film has a thickness of 100 nm or less, and the protective insulating film is formed on any one of the active layer, an LDD region, and a source-drain region. Preferably, in the bottom-gate thin-film transistor, the active layer is composed of a polysilicon film.

In another aspect of the present invention, a method for making a bottom-gate thin-film transistor includes a step (1) of forming a gate electrode on a substrate; a step (2) of forming a gate insulating film on the gate electrode; a step (3) of forming a laminate comprising a precursor film for an active layer, and a protective insulating film on the gate insulating film, the protective insulating film having a thickness of 100 nm or less; a step (4) of implanting a dopant in an LDD region or a source-drain region of the precursor film for the active layer through the protective insulating film; and a step (5) of activating the implanted dopant so that a non-doped portion constitutes the active layer.

In accordance with the present invention, in a bottom-gate TFT, since a protective insulating film on a polysilicon film for forming an active layer has a thickness of 100 nm or less, and an LDD region or a source-drain region is formed though the protective insulating film, it is not required to etch the protective insulating film in order to form the LDD region or the source-drain region. Therefore, the number of process steps can be decreased, and the productivity of the TFT can be improved. It is also possible to prevent an insufficient breakdown voltage of a gate insulating film, and point defects and line defects of the active layer are greatly decreased, thus improving the yield of the product.

In another aspect of the present invention, a liquid crystal display device includes a TFT substrate including an interlayer insulating film, a transparent electrode, and an alignment layer formed on the protective insulating film of the bottom-gate thin-film transistor described above; a counter substrate provided with a counter electrode; and a liquid crystal interposed between the TFT substrate and the counter substrate. In another aspect of the present invention, a method for fabricating a liquid crystal display device includes the steps of: making a bottom-gate thin-film transistor by the method described above; forming an interlayer insulating film, a transparent electrode, and an alignment layer on a protective insulating film of the bottom-gate thin-film transistor to constitute a TFT substrate; and interposing a liquid crystal between the TFT substrate and a counter substrate provided with a counter electrode.

In another aspect of the present invention, an organic EL device includes the bottom-gate thin-film transistor described above and an organic EL element driven by the bottom-gate thin-film transistor. In another aspect of the present invention, a method for fabricating an organic EL device includes the steps of: making a bottom-gate thin-film transistor by the method described above; forming an interlayer insulating film on a protective insulating film of the bottom-gate thin-film transistor; and forming an organic EL element driven by the bottom-gate thin-film transistor on the interlayer insulating film.

BRIEF DESCRIPTION OF THE DRAWINGS

FIGS. 7A to 7G are schematic sectional views showing the steps for fabricating the liquid crystal display device shown in FIG. 6.

DESCRIPTION OF THE PREFERRED EMBODIMENTS

Figure 1:
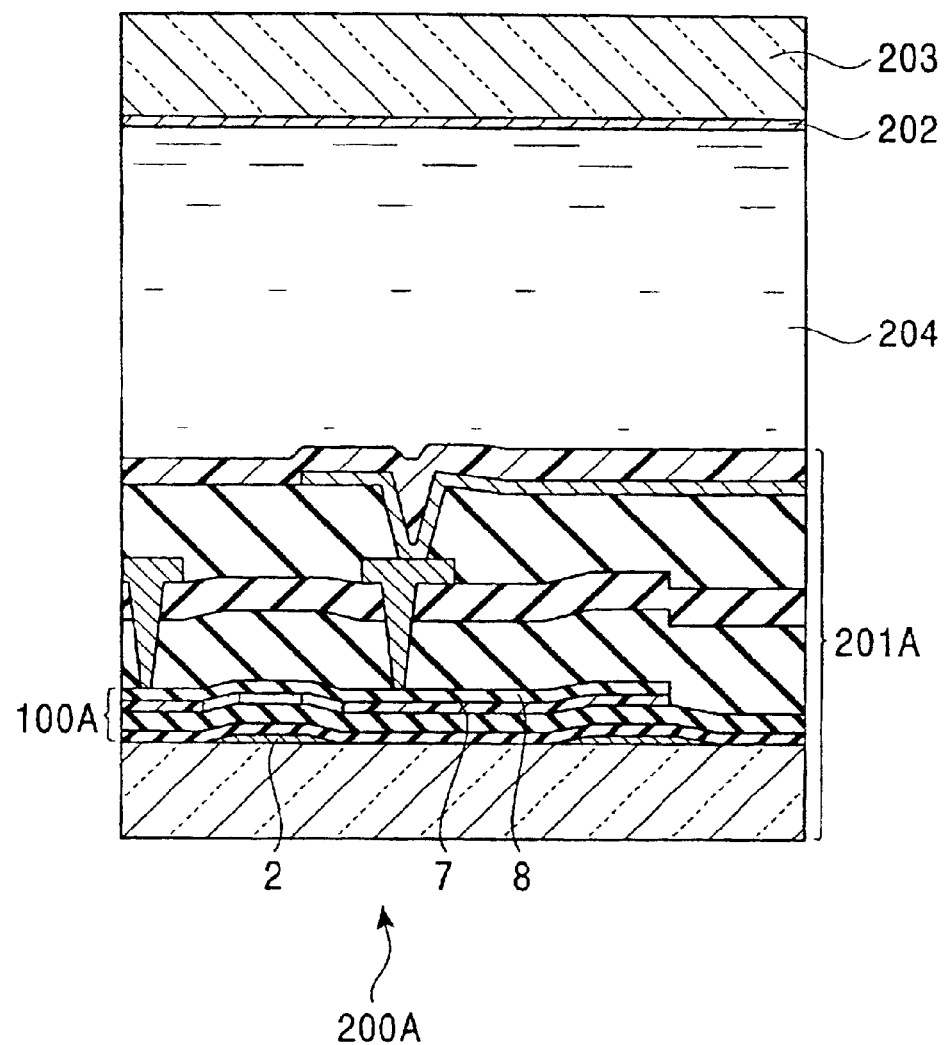
FIG. 1 is a schematic sectional view of a liquid crystal display device using a TFT in an embodiment of the present invention.

The present invention will be described in detail with reference to the drawings. In the drawings, the same reference numerals represent the same or equivalent elements.

FIG. 1 is a schematic sectional view of a liquid crystal display device using a bottom-gate thin-film transistor in an embodiment of the present invention, and FIGS. 2A to 2F and FIGS. 3A to 3D are schematic sectional views showing the steps for fabricating the liquid crystal display device shown in FIG. 1.

Figure 2A:
FIGS. 2A to 2F are schematic sectional views showing the steps for fabricating the liquid crystal display device shown in FIG. 1.

In the fabrication process in this embodiment, step (1) of forming a gate electrode on a substrate and step (2) of forming a gate insulating film on the gate electrode are carried out in the same manner as that in the conventional fabrication method. That is, in step (1), a gate electrode 2 composed of a metal, such as Cr, Al, Mo, or Ta, is formed, with a thickness of 10 to 400 nm, on a transparent glass substrate 1. The gate electrode 2 is subjected to oxidation treatment as necessary, and an insulating layer which acts as a part of a gate oxide film may be formed on the gate electrode 2. A Cs electrode 3 is similarly formed, as shown in FIG. 2A.

Figure 2B:

In step (2), a gate insulating film 6 is formed on the gate electrode 2, and the gate insulating film 6, for example, consists of a silicon nitride film 4 with a thickness of 10 to 100 nm deposited by plasma CVD and a silicon oxide film 5 with a thickness of 50 to 200 nm deposited by plasma CVD, as shown in FIG. 2B. Alternatively, the silicon nitride film 4 and the silicon oxide film 5 may be formed by ECR-CVD or thermal CVD.

Figure 2C:
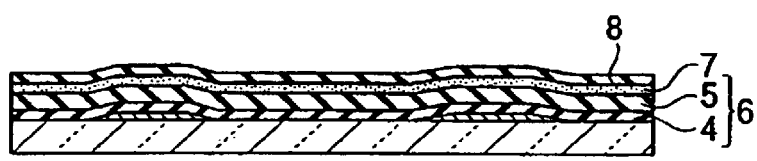

In this embodiment, in step (3) in the fabrication method of the present invention, namely, a step of forming a laminate comprising a precursor film for an active layer, and a protective insulating film on the gate insulating film, the protective insulating film having a thickness of 100 nm or less, after the gate insulating film 6 is formed, an amorphous silicon film is deposited by plasma CVD with a thickness of 10 to 100 nm, and the amorphous silicon film is then crystallized by thermal annealing with an infrared lamp, laser annealing, or the like, to form a polysilicon film 7, as shown in FIG. 2C. The polysilicon film 7 constitutes an active layer. The polysilicon film 7 may be directly formed by thermal CVD or the like.

A protective insulating film 8 composed of a silicon oxide is then formed with a thickness of 100 nm or less by thermal CVD, plasma CVD, or the like, as shown in FIG. 2C.

In the present invention, as described above, the protective insulating film 8 is formed with a thickness of 100 nm or less, and in the subsequent step of forming an LDD region or a source-drain region, a dopant, such as phosphorus or arsenic, is injected through the protective insulating film 8, without etching the protective insulating film 8. Thereby, the etching process of the protective insulating film 8 in the conventional method (refer to FIGS. 7D and 7F) can be eliminated, thus improving the productivity. Additionally, since the polysilicon film 7 is not etched unnecessarily, an insufficient breakdown voltage of the gate insulating film 6 can be prevented, and also point defects and line defects of the polysilicon film 7 are greatly decreased, thus improving the yield of the product.

The thickness of the protective insulating film 8 is set at 100 nm or less due to a limited accelerating voltage of an implanter used for implanting the dopant, such as phosphorus or arsenic, through the protective insulating film 8. Preferably, the thickness of the protective insulating film 8 is set at 50 nm or less in order to reduce the production cost using an implanter with a low accelerating voltage. On the other hand, if the protective insulating film 8 is not formed, in the step of forming the LDD region, a resist mask for forming the LDD region (LDD-injection mask) is brought into direct contact with the polysilicon film 7 as the active layer, and in the subsequent step of forming a source-drain region, an N-channel SD-injection mask and a P-channel SD-injection mask are brought into direct contact with the polysilicon film 7, resulting in contamination of the polysilicon film 7. Therefore, preferably, the protective insulating film 8 has a thickness of 5 nm or more.

Figure 2D:
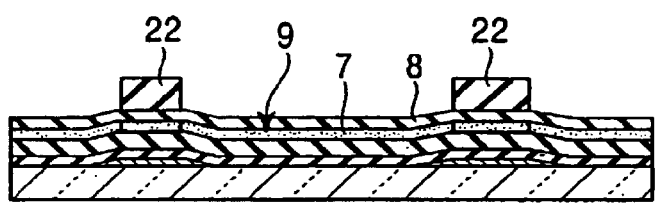

In this embodiment, in step (4) in the fabrication method of the present invention, namely, a step of implanting a dopant in an LDD region or a source-drain region of the precursor film for the active layer through the protective insulating film, first, an LDD-injection mask 22 is formed on the protective insulating film 8, and an LDD region 9 is formed by injecting phosphorus, arsenic, or the like, as shown in FIG. 2D. Next, in order to form an N-channel source-drain region (SD region) 10, an N-channel SD-injection mask 11 is formed, and phosphorus, arsenic, or the like is injected at a high concentration. At this stage, since injection is also performed on the polysilicon film 7 in an auxiliary capacitor region formed by the polysilicon film 7 and the gate electrode 2, the resist mask is not formed in the auxiliary capacitor region. Additionally, when a C-MOS circuit or the like is constructed, in order to form a P-channel source-drain region, a mask is formed again using a resist, etc., and boron or the like is implanted.

Figure 2E:
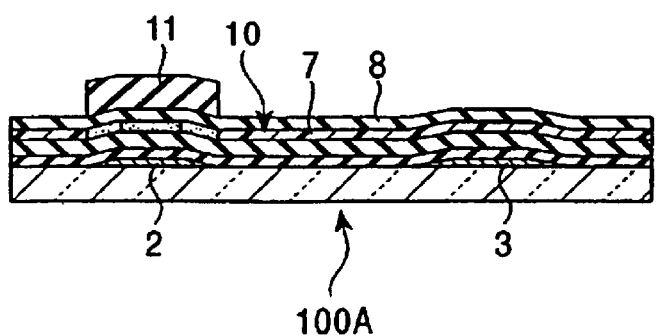

Next, in step (5) in the present invention, in order to activate the implanted dopant such as phosphorus, thermal annealing or laser annealing is performed. Thus, a TFT 100A is obtained, as shown in FIG. 2E.

Figure 2F:
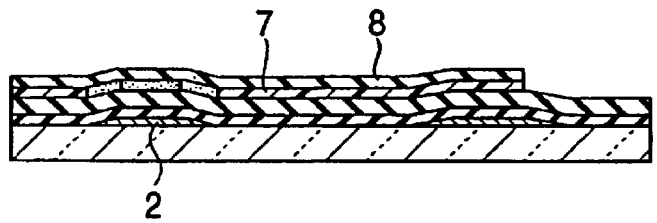

In order to fabricate a liquid crystal display device using the TFT 100A as an active element, a resist is placed on the section having the TFT 100A, and unwanted portions of the protective insulating film 8 and the polysilicon film 7 are patterned, as shown in FIG. 2F. In such a case, the protective insulating film 8 is usually etched by hydrofluoric acid-based wet etching or fluorine-based dry etching. Etching of the polysilicon film 7 is often performed by F-based or Cl-based dry etching.

Figure 3A:
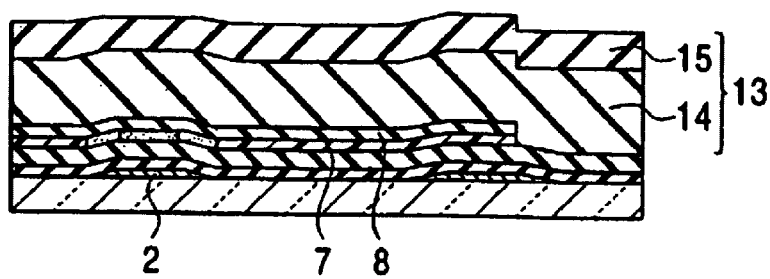
FIGS. 3A to 3D are schematic sectional views showing the steps for fabricating the liquid crystal display device subsequent to the steps shown in FIGS. 2A to 2F.
Figure 3B:
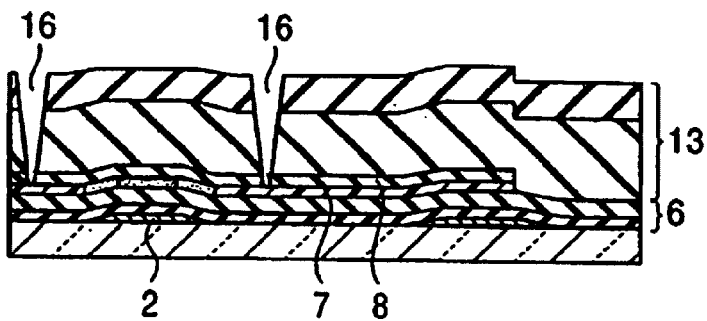
Figure 3C:
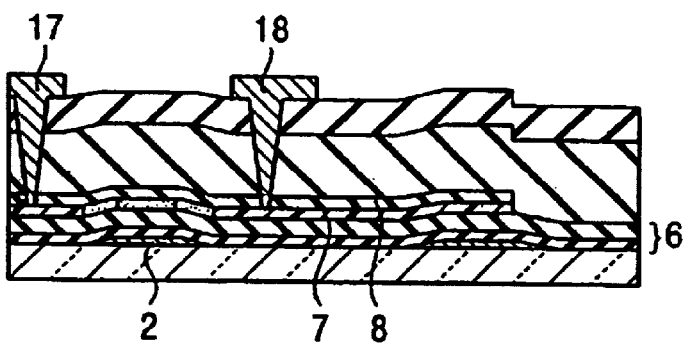
Figure 3D:
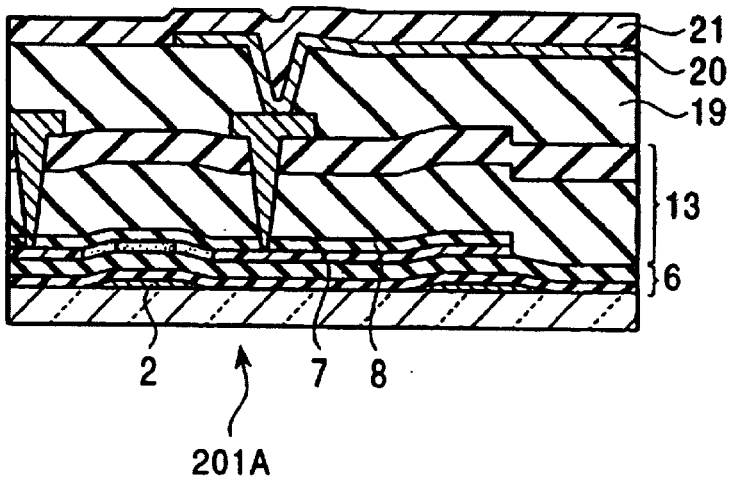

Next, an interlayer insulating film 13 is formed, a source electrode 17 and a drain electrode 18 are formed, a transparent electrode 20 is formed, and an alignment layer 21 is formed on the transparent electrode 20 in a manner similar to that in the conventional method. That is, in order to form the interlayer insulating film 13, a silicon nitride film 14 (50 to 500 nm) and a silicon oxide film 15 (50 to 500 nm) are continuously deposited, as shown in FIG 3A. Next, contact holes 16 are made by etching the interlayer insulating film 13 and the protective insulating film 8, as shown in FIG. 3B, and a metal, such as Al, is embedded in the contact holes 16 to form the source electrode 17 and the drain electrode 18, as shown in FIG. 3C. The planarizing layer 19 formed of an organic planarizing film composed of an organic acrylic resin, a silicon nitride planarizing film, or the like is formed in the region excluding a section for forming a contact with the transparent electrode of the liquid crystal display panel and a pad-forming section. The transparent electrode 20 composed of ITO or the like is then formed so as to cover the pixel section, and the alignment layer 21 is formed on the transparent electrode 20. Thus, a TFT substrate 201A for a liquid crystal display device having the TFT 100A of the present invention as the active element is obtained, as shown in FIG. 3D.

A liquid crystal display device 200A shown in FIG. 1 is fabricated by combining the TFT substrate 201A and a counter substrate 203 provided with a known counter electrode 202, and interposing a liquid crystal 204 between both substrates by a known process.

The TFT and the fabrication method thereof in the embodiment have been described with reference to the liquid crystal display device 200A using the TFT. It is to be understood that the present invention is not limited to the above embodiment, and the invention is intended to cover various modifications as long as the protective insulating film 8 on the precursor film for the active layer has a thickness of 100 nm or less, and the dopant is injected through the protective insulating film 8 to form the LDD region or the source-drain region.

For example, in the TFT 100A in the embodiment of the present invention described above, although the precursor film for the active layer to which the dopant is implanted is a polysilicon film 7, the precursor film for the active layer is not limited thereto. For example, an amorphous silicon film, a silicon-germanium alloy film, or a silicon carbide film may be used as the precursor film for the active layer. In view of process compatibility, the polysilicon film is preferably used.

In the method for fabricating the TFT 100A in the embodiment, in step (3), the amorphous silicon film is deposited on the gate insulating film 6, the amorphous silicon film is crystallized to form the polysilicon film 7, and the protective insulating film 8 is deposited on the polysilicon film 7. However, after the amorphous silicon film is formed by CVD or the like, instead of crystallizing the amorphous silicon film, the protective insulating film 8 may be formed continuously by CVD without breaking vacuum, and then the amorphous film may be crystallized to form the polysilicon film 7. Thereby, the polysilicon film 7 is further prevented from being contaminated.

Moreover, in the method for fabricating the TFT 100A in the embodiment, in step (3),-the protective insulating film 8 composed of a silicon oxide is formed by plasma CVD or the like. However, the protective insulating film 8 may be formed by surface oxidation of the amorphous silicon film for forming the polysilicon film 7. In order to perform surface oxidation, for example, the amorphous silicon film may be exposed to hot steam of approximately 400° C. or ozone, or may be irradiated with ultraviolet light in an atmosphere containing oxygen. In such a method, since a silicon oxide film with a thickness of 5 to 20 nm can be formed with satisfactory thickness control, controllability of the thickness of the polysilicon film and controllability of the crystallization improve when the amorphous silicon film is crystallized by laser annealing or the like to form the polysilicon film 7. Alternatively, the protective insulating film 8 may be formed by performing low-temperature thermal oxidation at 600° C. at a high pressure of approximately 1 MPa (high pressure annealing).

In the present invention, since the dopant is injected through the protective insulating film 8 to form the LDD region or the source-drain region, defects occur in the protective insulating film 8. In particular, in the LDD region, since the amount of doping is small, a change in resistance occurs due to the defects of the upper part of the protective insulating film 8. Furthermore, during the process, ashing or the like is performed to strip the solidified resist, which also causes the defects in the protective insulating film 8 above the channel or LDD region. Therefore, treatment for recovering defects is preferably performed. More specifically, after the source-drain region 10 is formed in step (4), or after the interlayer insulating film 13 is formed, thermal energy irradiation at approximately 200 to 650° C., RTA, laser irradiation, or the like is preferably performed. In particular, preferably, the treatment for recovering defects is combined with the step of activating the implanted dopant or with the step of hydrogenating the polysilicon film 7 subsequent to the formation of the silicon nitride film 14 because the number of steps is not increased. In the step of activating the dopant, in order to perform defect recovery simultaneously, preferably, the temperature is momentarily raised to approximately 600° C. by RTA, or the like.

The TFT or the method for fabricating the same in the present invention can be employed in an organic EL device having the TFT as a driving element or a method for fabricating the same.

For example, an organic EL device 300 shown in FIG. 4 may be fabricated by forming a TFT substrate according to the method described above, and by following a known method for fabricating an organic EL device, such as the one disclosed in Japanese Unexamined Patent Application Publication No. 11-251069 or 10-189252, as described below. First, on a transparent glass substrate 1, a TFT 100A is formed in which a gate electrode 2, a gate insulating film 6, an active layer comprising a polysilicon film 7, and a protective insulating film 8 having a thickness of 100 nm or less are deposited in that order. Next, an interlayer insulating film 13 is formed on the TFT 100A, a source electrode 17 and a drain electrode 18 are formed, a planarizing film 19 is formed, and a contact hole 23 is made in the planarizing film 19. A cathode layer 31 of an organic EL element 30 is formed on the planarizing film 19, and the cathode layer 31 is electrically connected to the source electrode 17 of the TFT 100A through the contact hole 23. An electron-transporting layer 32, a luminescent layer 33, and a hole-transporting layer 34 are formed in that order on the cathode layer 31, and an anode layer 35 is further formed on the hole-transporting layer 34. In the organic EL element 30, holes injected from the anode layer 35 and electrons injected from-the cathode layer 31 are recombined in the luminescent layer 33 to generate light, and an organic EL device 300 in which the luminescence is driven by the TFT of the present invention is fabricated. Additionally, in the organic EL device 300, light outgoes from the side of the anode layer 35.

The layer structure of the organic EL element 30 itself and the materials for the individual layers are not particularly limited, and the material and the formation method for the planarizing film 19 between the TFT 100A and the organic EL element 30 are not particularly limited.

For example, the planarizing film 19 may be composed of a silicon oxide film, a silicon nitride film, a silicon oxynitride film, a silicate glass film, an SOG film, or a synthetic resin film, such as a polyimide film, or an acrylic film.

For example, the cathode layer 31 may be composed of a magnesium-indium alloy, or an aluminum-lithium alloy. The electron-transporting layer 32 may be composed of Bebq2 (10-benzo[h]quinolinol-beryllium complex), and the luminescent layer 33 may be composed of a Bebq2, 8-quinolinol-aluminum complex containing a quinacridone derivative. The hole-transporting layer 34 may be composed of TPD (4,4', 4"-tris(methylphenylphehylamino)triphenylamine), MTDATA(4,4'-bis(3-methylphenylphenylamino)biphynyl), or α-NPD (α-naphtylphenyldiamine), and the anode layer 35 may be composed of Pt, Rh, or Pd. The individual layers may be formed by vapor deposition, or the like. Additionally, the positive electrode layer 35 may be formed by sputtering using ITO or the like.

Figure 4:
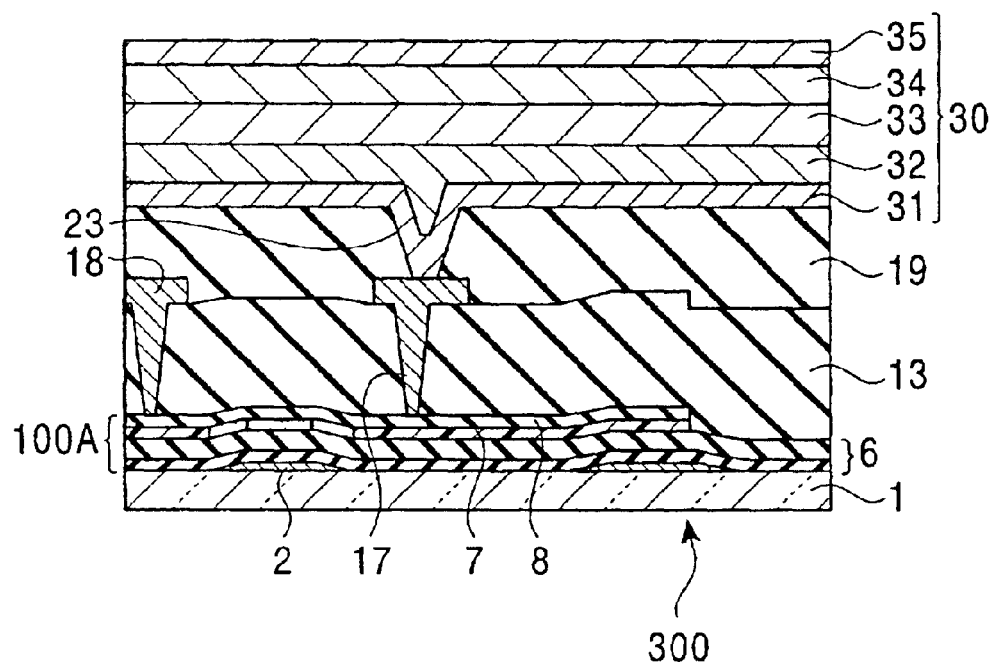
FIG. 4 is a schematic sectional view of an organic EL device using a TFT in an embodiment of present invention.
Figure 5:
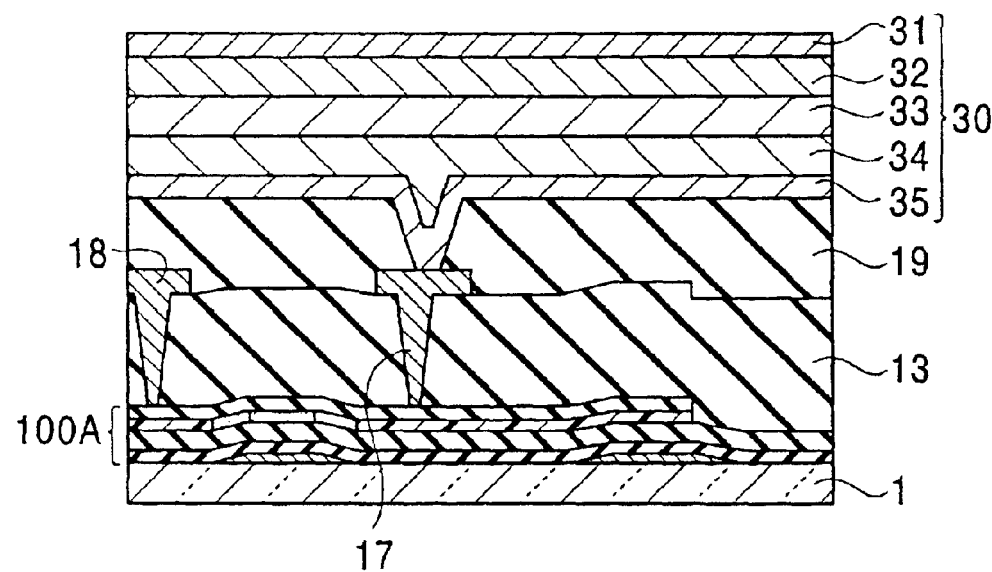
FIG. 5 a schematic sectional view of an organic EL device using a TFT in an embodiment of present invention.
Figure 6:
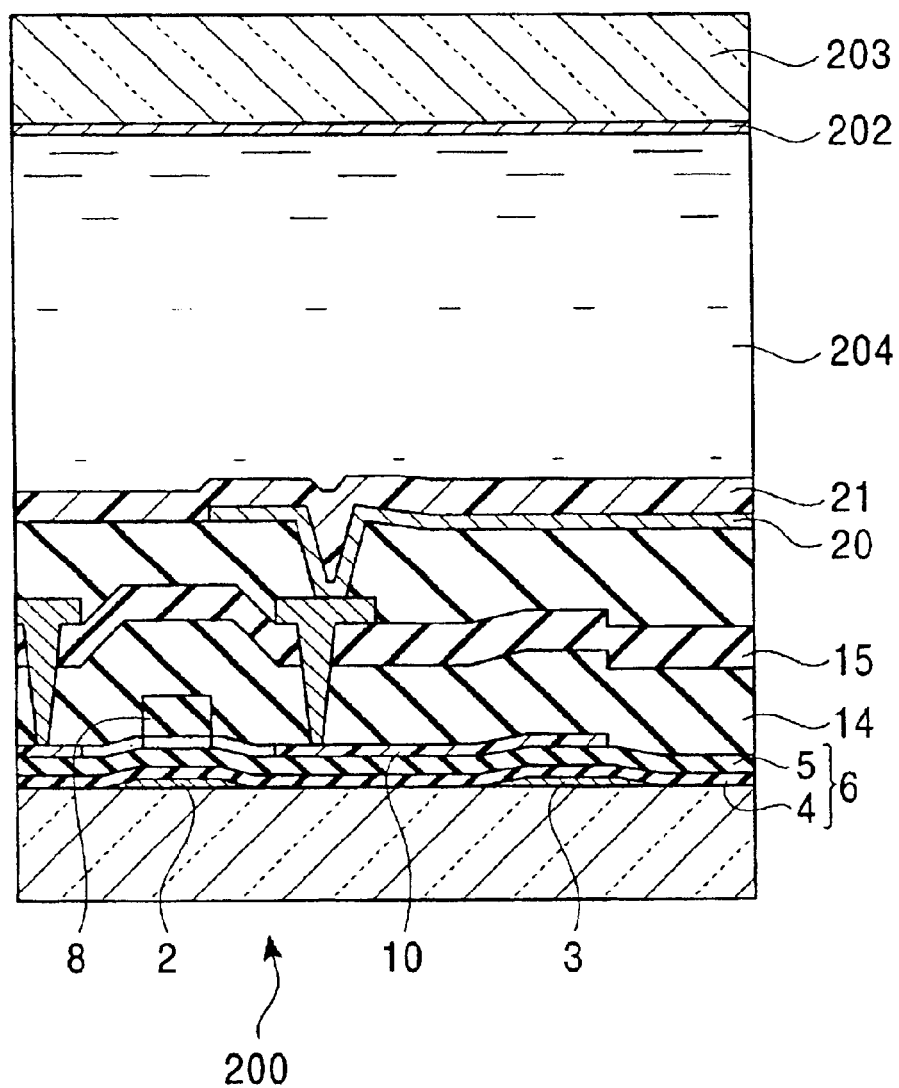
FIG. 6 is a schematic sectional view of a liquid crystal display device using a conventional TFT.
Figure 8H:
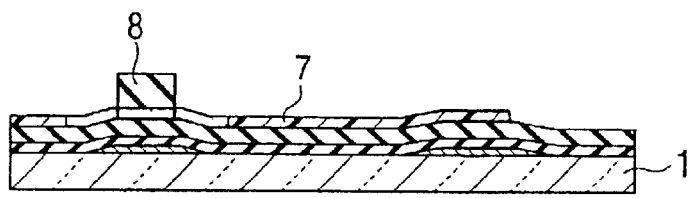
FIGS. 8H to 8L are schematic sectional views showing the steps for fabricating the liquid crystal display device subsequent to the steps shown in FIGS. 7A to 7G.
Figure 8I:
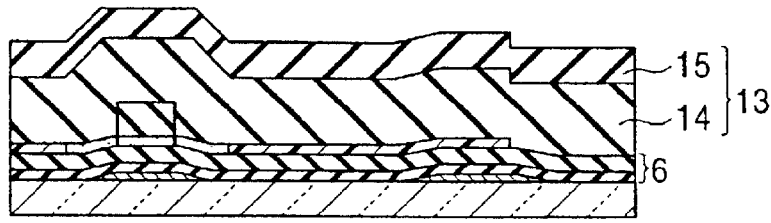
Figure 8J:
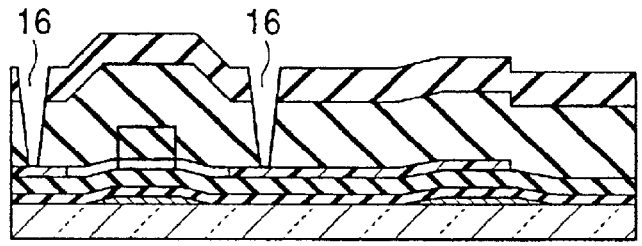
Figure 8K:
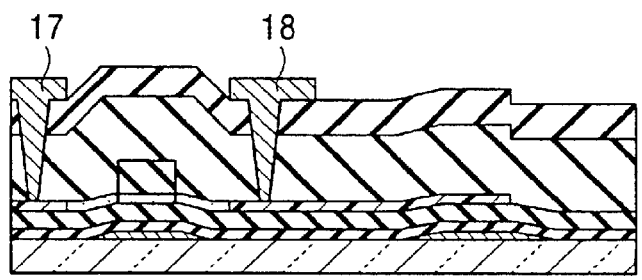
Figure 8L:
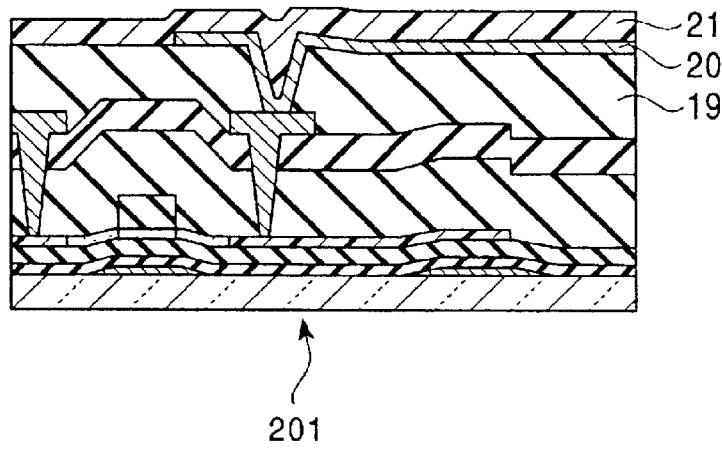

FIG. 5 is a schematic sectional view of another organic EL device driven by the TFT, in which the layer structure of an organic EL element 30 on a TFT 100A is reversed from that of the organic EL element 30 shown in FIG. 4. In this organic EL element, an anode layer 35, a hole-transporting layer 34, a luminescent layer 33, an electron-transporting layer 32, and a cathode layer 31 are deposited in that order on a planarizing layer 19. In this organic EL element, light outgoes from the side of a substrate 1.

Additionally, it is to be understood that the present invention is not limited to the organic EL devices described above, and the invention is intended to cover various modifications as long as the TFT of the present invention is used.

What is claimed is:

1. A bottom-gate thin-film transistor comprising:
   a gate electrode, a gate insulating film, an active layer, and a protective insulating film deposited in that order on a substrate; and
   a plurality of layers formed over said protective film with at least one electrode extending therethrough that is operatively and electrically connected to one of said active layer, an LDD region and a source-drain region;
   wherein the protective insulating film has a thickness of less than 100 nm and greater than 50 nm, and the protective insulating film is formed on any one of the active layer, LDD region, and source-drain region, and
   wherein there is no etched mask structure within the thin film transistor structure.

2. A bottom-gate thin-film transistor according to claim 1, wherein the active layer comprises a polysilicon film.

3. A liquid crystal display device comprising:
   a TFT substrate comprising an interlayer insulating film, a transparent electrode, and an alignment layer formed on a protective insulating film of a bottom-gate thin-film transistor according to any one of claims 1 to 2;
   a counter substrate provided with a counter electrode; and
   a liquid crystal interposed between the TFT substrate and the counter substrate.

4. An organic EL device comprising:
   a bottom-gate thin-film transistor according to any one of claims 1 to 2; and
   an organic EL element driven by the bottom-gate thin-film transistor.

* * * * *